(12) United States Patent
Sun

(10) Patent No.: US 11,171,283 B2
(45) Date of Patent: Nov. 9, 2021

(54) MODIFIED DOUBLE MAGNETIC TUNNEL JUNCTION STRUCTURE SUITABLE FOR BEOL INTEGRATION

(71) Applicant: International Business Machines Corporation, Armonk, NY (US)

(72) Inventor: Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 16/671,995

(22) Filed: Nov. 1, 2019

(65) Prior Publication Data

US 2021/0135090 A1 May 6, 2021

(51) Int. Cl.
*H01L 43/02* (2006.01)
*G11C 11/16* (2006.01)
*H01L 43/12* (2006.01)
*H01L 27/22* (2006.01)

(52) U.S. Cl.
CPC ............ *H01L 43/02* (2013.01); *G11C 11/161* (2013.01); *H01L 27/222* (2013.01); *H01L 43/12* (2013.01)

(58) Field of Classification Search
CPC ....... H01L 43/02; H01L 27/222; H01L 43/12; G11C 11/161
USPC ........................................................ 257/421
See application file for complete search history.

(56) References Cited

U.S. PATENT DOCUMENTS

| | | | |
|---|---|---|---|
| 6,469,926 B1 * | 10/2002 | Chen .................. | B82Y 25/00 360/324.11 |
| 6,822,838 B2 * | 11/2004 | Lin .................... | B82Y 10/00 360/314 |
| 7,230,265 B2 | 6/2007 | Kaiser et al. | |
| 7,430,135 B2 | 9/2008 | Huai et al. | |
| 7,576,956 B2 | 8/2009 | Huai | |
| 8,981,505 B2 * | 3/2015 | Moriyama ............ | G11C 11/161 257/421 |
| 9,093,640 B2 | 7/2015 | Aggarwal et al. | |
| 9,548,442 B2 | 1/2017 | Aggarwal et al. | |
| 9,553,258 B2 | 1/2017 | Whig et al. | |
| 10,147,872 B2 * | 12/2018 | Kardasz ................ | H01L 43/08 |

(Continued)

FOREIGN PATENT DOCUMENTS

| | | |
|---|---|---|
| CN | 104134748 A | 11/2014 |
| CN | 105374936 A | 3/2016 |

OTHER PUBLICATIONS

International Search Report dated Jan. 22, 2021, received in a corresponding foreign application, 11 pages.

(Continued)

*Primary Examiner* — Jami Valentine Miller

(74) *Attorney, Agent, or Firm* — Scully, Scott, Murphy & Presser, P.C.; Daniel P. Morris, Esq.

(57) ABSTRACT

A modified double magnetic tunnel junction (mDMTJ) structure is provided which includes a non-magnetic, spin-conducting metallic layer sandwiched between a magnetic free layer and a first tunnel barrier layer; the first tunnel barrier layer contacts a first magnetic reference layer. A second tunnel barrier layer is located on the magnetic free layer and a second magnetic reference layer is located on the second tunnel barrier layer. The mDMTJ structure of the present application exhibits efficient switching (at a low current) and speedy readout (high TMR).

26 Claims, 5 Drawing Sheets

(56) References Cited

U.S. PATENT DOCUMENTS

| | | |
|---|---|---|
| 10,381,550 B1 | 8/2019 | Duan et al. |
| 10,468,455 B2 | 11/2019 | Hu et al. |
| 10,522,746 B1 | 12/2019 | Sundar et al. |
| 10,665,777 B2 * | 5/2020 | Kardasz .................. H01L 43/10 |
| 10,797,225 B2 | 10/2020 | Sundar et al. |
| 10,964,468 B2 * | 3/2021 | Salahuddin ........... G11C 11/161 |
| 2007/0019463 A1 | 1/2007 | Saito et al. |
| 2017/0098762 A1 | 4/2017 | Worledge |
| 2017/0294482 A1 | 10/2017 | Hu et al. |
| 2018/0226574 A1 | 8/2018 | Whig et al. |
| 2019/0006583 A1 | 1/2019 | Tahmasebi |
| 2019/0088713 A1 | 3/2019 | Swerts |

OTHER PUBLICATIONS

List of IBM Patents or Patent Applications Treated as Related, dated Apr. 1, 2021, 2 pages.

Wang, G., et al., "Compact Modeling of Perpendicular-Magnetic-Anisotropy Double-Barrier Magnetic Tunnel Junction With Enhanced Thermal Stability Recording Structure", IEEE Transactions On Electron Devices, May 2019, pp. 2431-2436, vol. 66, No. 5.

* cited by examiner

MODIFIED DOUBLE MAGNETIC TUNNEL JUNCTION STRUCTURE SUITABLE FOR BEOL INTEGRATION

BACKGROUND

The present application relates to magnetoresistive random access memory (MRAM). More particularly, the present application relates to a modified double magnetic tunnel junction (mDMTJ) structure that can improve the performance of spin-transfer torque (STT) MRAM and which can be integrated into the back-end-of-the-line (BEOL) processing of semiconductor technologies (such as CMOS technologies).

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory. In MRAM, such elements may be referred to as a magnetic tunnel junction (MTJ) structure. FIG. 1 illustrates a prior art MTJ structure 10 that includes a magnetic reference layer 12, a tunnel barrier layer 14 and a magnetic free layer 16. The sole arrow shown in the magnetic reference layer 12 illustrates a possible orientation of that layer, and the two arrows in the magnetic free layer 16 illustrate that the orientation in that layer can be switched.

In the MTJ structure 10 of FIG. 1, the magnetization of the magnetic reference layer 12 is fixed in one direction (say pointing up), while the direction of the magnetic free layer 16 can be "switched" by some external forces, such as a magnetic field or a spin-transfer torque generating charge current. A smaller current (of either polarity) can be used to read the resistance of the device, which depends on the relative orientations of the magnetizations of the magnetic free layer 16 and the magnetic reference layer 12. The resistance is typically higher when the magnetizations are anti-parallel, and lower when they are parallel (though this can be reversed, depending on the material).

One type of MRAM that can use the MTJ structure 10 shown in FIG. 1 is STT MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer 16 parallel to the magnetic reference layer 12, while a current passed up through the MTJ structure makes the magnetic free layer 16 anti-parallel to the magnetic reference layer 12.

In STT MRAMs, it is desirable to reduce the switching current to match a small transistor size, so as to improve the memory area density. One method of reducing the switching current by about 2× is the concept of a double magnetic tunnel junction (DMTJ) structure 20 such as is shown in FIG. 2. The DMTJ structure 20 of FIG. 2 includes a first magnetic reference layer 22, a first tunnel barrier layer 24, a magnetic free layer 26, a second tunnel barrier layer 28 and a second magnetic reference layer 30. The sole arrow shown in each of the first magnetic reference layer 22 and the second magnetic reference layer 30 illustrates a possible orientation of the layer, and the two arrows in the magnetic free layer 26 illustrate that the orientation in that layer can be switched. One drawback of the DMTJ structure shown in FIG. 2 is, while it reduces the switching current, it also reduces tunnel magnetoresistance (TMR), hampering efficient readout of the device.

There is thus a need for providing a DMTJ structure which has reduced switching current, while mitigating the reduction of TMR within the structure such that the DMTJ structure exhibits efficient switching (at a low current) and speedy readout (high TMR).

SUMMARY

A modified double magnetic tunnel junction (mDMTJ) structure is provided which includes a non-magnetic, spin-conducting metallic layer sandwiched between a magnetic free layer and a first tunnel barrier layer; the first tunnel barrier layer contacts a first magnetic reference layer. A second tunnel barrier layer is located on the magnetic free layer and a second magnetic reference layer is located on the second tunnel barrier layer. The mDMTJ structure of the present application exhibits efficient switching (at a low current) and speedy readout (high TMR). By "low current" it is meant a current of less than a current required by a typical single MTJ device for accomplishing the same error-free write. In some embodiments, the low current could reach, or is below, 20 to 50 µA. By "high TMR" it is meant a tunnel magnetoresistance of greater value than a typical DMTJ device would accomplish. In some embodiments, the high TMR could reach, or exceeds, 100-200%.

In one aspect of the present application, a mDMTJ structure that exhibits efficient switching and speedy readout is provided. In one embodiment, the mDMTJ structure includes a first magnetic reference layer, a first tunnel barrier layer having a first surface contacting a surface of the first magnetic reference layer, a non-magnetic, spin-conducting metallic layer having a first surface contacting a second surface of the first tunnel barrier layer which is opposite the first surface of the first tunnel barrier layer, a magnetic free layer having a first surface contacting a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer.

In another aspect of the present application, a STT MTJ memory element is provided. In one embodiment, the STT MTJ memory element includes a mDMTJ structure sandwiched between a first electrode and a second electrode. The mDMTJ structure includes a first magnetic reference layer, a first tunnel barrier layer having a first surface contacting a surface of the first magnetic reference layer, a non-magnetic, spin-conducting metallic layer having a first surface contacting a second surface of the first tunnel barrier layer which is opposite the first surface of the first tunnel barrier layer, a magnetic free layer having a first surface contacting a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer.

In a further aspect of the present application, a method of forming a mDMTJ structure is provided. In one embodiment, the method includes forming a lower material stack of the mDMTJ structure, wherein the lower material stack includes, from bottom to top, a first magnetic reference layer, a first tunnel barrier layer, and a non-magnetic, spin-conducting metallic layer. Next, an upper material stack of the mDMTJ structure is formed on a physically exposed topmost surface of the lower material stack of the mDMTJ structure, wherein the upper material stack includes, from bottom to top, a magnetic free layer, a second tunnel barrier layer, a magnetic free layer, and a second magnetic reference layer. In this embodiment, the magnetic free layer forms an interface with the non-magnetic, spin-conducting metallic layer.

In some embodiments, and to avoid surface contamination, the upper material stack includes another non-magnetic, spin-conducting metallic layer of a same non-magnetic, spin-conducting metallic material as the non-magnetic, spin-conducting metallic layer of the lower material stack, wherein the another non-magnetic, spin-conducting metallic layer of the upper material stack forms an interface with the non-magnetic, spin-conducting metallic layer of the lower material stack.

In another embodiment, the method includes forming a lower material stack of the mDMTJ structure, wherein the lower material stack includes, from bottom to top, a second magnetic reference layer, a second tunnel barrier layer, and a magnetic free layer. Next, an upper material stack of the mDMTJ structure is formed on a physically exposed topmost surface of the lower material stack of the mDMTJ structure, wherein the upper material stack includes, from bottom to top, a non-magnetic, spin-conducting metallic layer, a first tunnel barrier layer, and a first magnetic reference layer. In this embodiment, the non-magnetic, spin-conducting metallic layer of the upper material stack is in direct contact with a surface of the magnetic free layer of the lower material stack.

In some embodiments, and to avoid surface contamination, the lower material stack includes another non-magnetic, spin-conducting metallic layer of a same non-magnetic, spin-conducting metallic material as the non-magnetic, spin-conducting metallic layer of the upper material stack, wherein the another non-magnetic, spin-conducting metallic layer of the lower material stack forms an interface with the non-magnetic, spin-conducting metallic layer of the upper material stack.

The methods of the present application, which decouple the formation of non-magnetic, spin-conducting metallic material into two separate layers, allow for more flexibility in materials and growth engineering and fabrication optimization.

DETAILED DESCRIPTION

Figure 1:
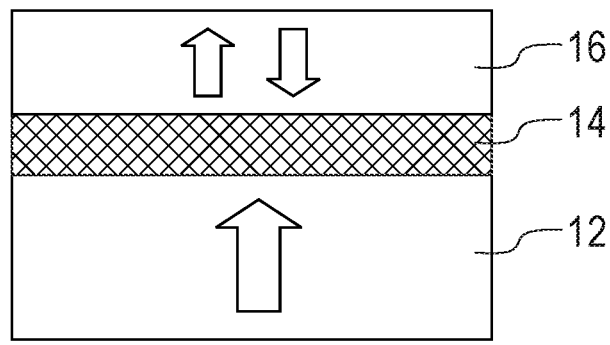
FIG. 1 is a cross sectional view of a prior art MTJ structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides mDMTJ structures 100 as shown, for example, in FIGS. 3, 5A, 5B, 6, 7A and 7B which can be integrated in the BEOL and used as a component of a STT MRAM. The mDMTJ structures 100 of the present application and as shown, for example, in FIGS. 3, 5A, 5B, 6, 7A and 7B include a first magnetic reference layer 102, a first tunnel barrier layer 104 having a first surface contacting a surface of the first magnetic reference layer 102, a non-magnetic, spin-conducting metallic layer 106 having a first surface contacting a second surface of the first tunnel barrier layer 104 which is opposite the first surface of the first tunnel barrier layer 104, a magnetic free layer 108 having a first surface contacting a second surface of the non-magnetic, spin-conducting metallic layer 106 which is opposite the first surface of the non-magnetic, spin-conducting metallic layer 106, a second tunnel barrier layer 110 having a first surface contacting a second surface of the magnetic free layer 108 which is opposite the first surface of the magnetic free layer 108, a second magnetic reference layer 112 having a first surface contacting a second surface of the second tunnel barrier layer 110 which is opposite the first surface of the second tunnel barrier layer 110.

Figure 2:
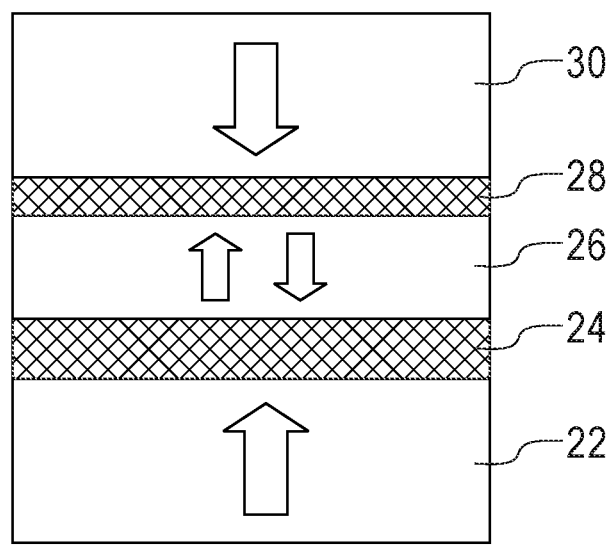
FIG. 2 is a cross sectional view of a prior art DMTJ structure.

The non-magnetic, spin-conducting metallic layer 106 is a spin-conserving metallic material with a long spin-flip scattering lifetime. The non-magnetic, spin-conducting metallic layer 106 receives spin-current that is polarized by the first magnetic reference layer 102 when tunneling across the first tunnel barrier layer 104, and effectively transmits that spin-current to the magnetic free layer 108 assisting STT-inducing switching. At the same time, the non-magnetic, spin-conducting metallic layer 106 reduces to close to zero the spin polarization of the density-of-state (DOS) at the interface between the non-magnetic, spin-conducting metallic layer 106 and the first tunnel barrier layer 104. Consequently the magnetoresistance across the first tunnel barrier layer 104 is reduced to zero, thus avoiding the magnetoresistance cancellation effect that plagues a prior art DMTJ structure such as is shown, for example, in FIG. 2 of the present application.

This reduction of DOS spin polarization at the interface between the non-magnetic, spin-conducting metallic layer 106 and the first tunnel barrier layer 104 also reduces significantly the spin-current with polarization defined by the magnetic free layer 108 that could enter the first magnetic reference layer 102, thus reducing spin-torque, and STT-related disturbances of the magnetic reference layer 102 from the magnetic free layer 108. The mDMTJ structures 100 of the present application thus exhibit efficient switching (at a low current as defined above), speedy readout (high TMR as defined above), and a reduction to the potential disturbance on reference layer (102)'s magnetic state (disturbance that can cause write-errors as well).

In the embodiments shown in FIGS. 5A-5B and 7A-7B, the first tunnel barrier layer 104 has a lateral dimension (i.e., width or pillar diameter) that is greater than a lateral dimension of the second tunnel barrier layer 110. This difference in lateral dimension between the first tunnel barrier layer 104 and the second tunnel barrier layer 110 reduces the demand on the first tunnel barrier layer 104 for having an ultra-low value of area specific resistance (i.e., resistance area product or RA). This also aids in the preservation of high TMR signal by reducing the overall added resistance to the mDMTJ structures 100.

The mDMTJ structures 100 of the present application allow for the first tunnel barrier 104 to operate at lower current density, mitigating concerns of device endurance over repeated write operations. Since such endurance tends to degrade rapidly with increasing operating current density (and voltage), a reduction of total tunnel resistance and tunnel current density (by increased area) is a favorable direction for endurance improvement.

Figure 3:
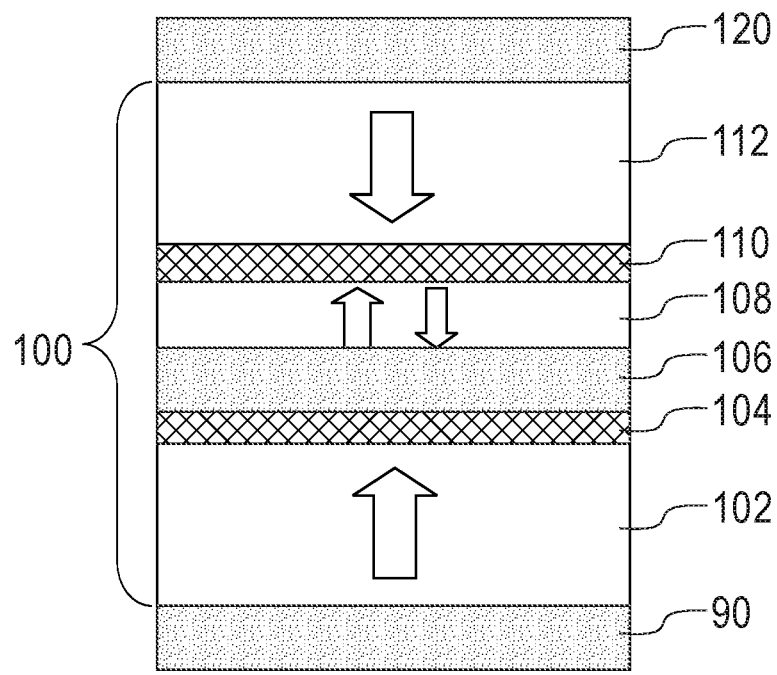
FIG. 3 is a cross sectional view of a mDMTJ structure in accordance with an embodiment of the present application.

Referring first to FIG. 3, there is illustrated a mDMTJ structure 100 in accordance with an embodiment of the present application. The mDMTJ structure 100 of FIG. 3 includes a first magnetic reference layer 102, a first tunnel barrier layer 104 contacting a surface of the first magnetic reference layer 102, a non-magnetic, spin-conducting metallic layer 106 contacting a surface of the first tunnel barrier layer 104, a magnetic free layer 108 contacting a surface of the non-magnetic, spin-conducting metallic layer 106, a second tunnel barrier layer 110 contacting a surface of the magnetic free layer 108, and a second magnetic reference layer 112 contacting a surface of the second tunnel barrier layer 110. As is shown, the mDMTJ structure 100 of FIG. 3 is located between a first electrode 90 and a second electrode 120. Collectively, the mDMTJ structure 100, the first electrode 90 and the second electrode 120 provide a STT MTJ memory element.

Although not depicted in FIG. 3, or any of the remaining drawings, the mDMTJ structure 100 can be embedded in various dielectric material layers, including interconnect dielectric materials, that are present in the BEOL. Although not depicted in FIG. 3, or any of the remaining drawings, a non-MRAM containing device area can be located laterally adjacent to the MRAM containing device area depicted in the drawings of the present application.

First electrode 90 can be present on a surface (recessed or non-recessed) of an electrically conductive structure such as, for example, a copper-containing structure, that is embedded in an interconnect dielectric material layer of one of the interconnect levels present in the BEOL. The first electrode 90 can be composed of Ta, TaN, Ti, TiN, Ru, RuN, RuTa, RuTaN, Co, CoWP, CoN, W, WN or any combination thereof. The first electrode 90 may also be composed of any other well known electrode material. The first electrode 90 can have a thickness from 2 nm to 25 nm; other thicknesses are possible and can be used in the present application as the thickness of the first electrode 90. The first electrode 90 can be formed by a deposition process such as, for example, sputtering, atomic layer deposition (ALD), chemical vapor deposition (CVD), plasma enhanced chemical vapor deposition (PECVD) or physical vapor deposition (PVD). An etch back process, a planarization process (such as, for example, chemical mechanical polishing, or CMP), or a patterning process (such as, for example, lithography and etching) can follow the deposition of the conductive material that provides the first electrode 90.

Next and as shown in FIG. 3, the mDMTJ structure 100 is formed on the first electrode 90. In FIG. 3, the first magnetic reference layer 102 is located at a bottom portion of the mDMTJ structure 100, and the second magnetic reference layer 112 is located at a top portion of the mDMTJ structure 100. In FIG. 3, each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is the same as the first lateral dimension. Thus, each of the various layers present in the mDMTJ structure 100 shown in FIG. 3 has an outermost sidewall(s) that is(are) related to each other, either vertically aligned or aligned with a controlled sidewall slope.

The various material layers of the mDMTJ structure 100 can be formed by utilizing one or more deposition processes such as, for example, sputtering, plasma enhanced atomic layer deposition (PEALD), plasma enhanced chemical vapor deposition (PECVD) or physical vapor deposition (PVD) which includes magnetron sputtering. In some embodiments, the various material layers of the mDMTJ structure 100 can be formed without breaking vacuum between the deposition of the various material layers. In other embodiments, the various material layers of the mDMTJ structure 100 can be formed by breaking vacuum between deposition of one or more of the various material layers. In some embodiments of the present application, the non-magnetic, spin-conducting metal layer 106 is formed in separate deposition steps such that a lower portion of the non-magnetic, spin-conducting metal layer 106 is formed and thereafter an upper portion of the non-magnetic, spin-conducting metal layer 106 is formed. The upper and lower portions of the non-magnetic, spin-conducting metal layer 106 are composed of same non-magnetic, spin-conducting metallic material. The presence of the non-magnetic, spin-conducting metal layer 106 makes it feasible to break vacuum in the middle of forming that material layer, as such same-material metallic interfaces are more readily "healed" via annealing at elevated temperatures (such as 400° C.) and interface-related defect effects minimized.

The first magnetic reference layer 102 has a fixed magnetization. The first magnetic reference layer 102 can be composed of a metal or metal alloy (or a stack thereof) that includes one or more metals exhibiting high spin polarization at the tunnel barrier interface. In alternative embodiments, exemplary metals for the formation of the first magnetic reference layer 102 include iron, nickel, cobalt, chromium, boron, or manganese. Exemplary metal alloys can include the metals exemplified by the above. In another embodiment, the first magnetic reference layer 102 can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the first magnetic reference layer 102. In some embodiments, the first magnetic reference layer 102 can include a lower magnetic reference layer, a synthetic anti-ferromagnetic coupling layer and an upper magnetic reference layer. This embodiment for the first magnetic reference layer 102 will be described in greater detail herein below in regard to FIG. 4.

The first tunnel barrier layer 104 is configured to provide spin-current, but not contributing to TMR opposing the second tunnel barrier's TMR, when interfaced with the non-magnetic, spin-conducting metallic layer 106. The first tunnel barrier layer 104 is composed of an insulator material such as, for example, magnesium oxide, aluminum oxide, and titanium oxide, or materials of higher electrical tunnel conductance, while preserving spin polarization, such as semiconductors or low-bandgap insulators. Due to the presence of the non-magnetic, spin-conducting metallic layer 106, the thickness of the first tunnel barrier layer 104 is not restricted to a resistance-area product that is much below that of the second tunnel barrier 110 for providing an appropriate tunneling resistance for the whole mDMTJ. Moreover, and in some embodiments, the first tunneling barrier layer 104 has a lower magnetoresistance than the second tunnel barrier layer 110, so as to not reduce the total amount of TMR of the mDMTJ stack.

The non-magnetic, spin-conducting metallic layer 106 is a spin-conserving metallic material with a long spin-flip scattering lifetime. In one embodiment of the present application, the non-magnetic, spin-conducting metallic layer 106 is composed of a spin conductor such as, for example, silver (Ag), copper (Cu), gold (Au), magnesium (Mg), aluminum (Al), chromium (Cr), vanadium (V) or alloys thereof such as a silver tin (Ag—Sn) alloy. In some embodiments, the non-magnetic, spin-conducting metallic layer 106 has a bodied centered cubic (bcc) crystal structure. In other embodiments, the non-magnetic, spin-conducting metallic layer 106 has a faced centered cubic (fcc) crystal structure. Other crystal structures adequate for preserving tunnel current's spin-polarization across the first tunnel barrier layer 104 could also be considered. The non-magnetic, spin-conducting metallic layer 106 has a thickness that is adequate to transmit a received spin-current into the magnetic free layer 108. In one embodiment, the thickness of the non-magnetic, spin-conducting metallic layer 106 is from 20 nm to 55 nm; although other thicknesses are possible so long as the thickness of the non-magnetic, spin-conducting metallic layer 106 is sufficient to transmit a received spin-current into the magnetic free layer 108.

The magnetic free layer 108 can be composed of a magnetic material (or a stack of magnetic materials) with a magnetization that can be changed in orientation relative to the magnetization orientation of the first magnetic reference layer 102 and the second magnetic reference layer 112. Exemplary magnetic materials for the magnetic free layer 108 include alloys and/or multilayers of cobalt, iron, alloys of cobalt-iron, nickel, alloys of nickel-iron, and alloys of cobalt-iron-boron.

The second tunnel barrier layer 110 is composed of an insulator material and is formed at such a thickness as to provide an appropriate tunneling resistance between the magnetic free layer 108 and the second magnetic reference layer 112. Exemplary materials for the second tunnel barrier layer 110 include magnesium oxide, aluminum oxide, and titanium oxide, or materials of higher electrical tunnel conductance, such as semiconductors or low-bandgap insulators. In some embodiments, the second tunnel barrier layer 110 is composed of a compositionally same insulator material as the first tunnel barrier layer 104. In other embodiments, the second tunnel barrier layer 110 is composed of a compositionally different insulator material than the first tunnel barrier layer 104.

The second magnetic reference layer 112 also has a fixed magnetization. The second magnetic reference layer 112 can be composed of a metal or metal alloy (or a stack thereof) that includes one or more metals exhibiting high spin polarization. In alternative embodiments, exemplary metals for the formation of the second magnetic reference layer 112 include iron, nickel, cobalt, chromium, boron, or manganese. Exemplary metal alloys can include the metals exemplified by the above. In another embodiment, the second magnetic reference layer 112 can be a multilayer arrangement having (1) a high spin polarization region formed of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong intrinsic or bulk (as opposed to interface) PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the second magnetic reference layer 112. In some embodiments, the second magnetic reference layer 112 can include a lower magnetic reference layer, a synthetic anti-ferromagnetic coupling layer and an upper magnetic reference layer. This embodiment for the second magnetic reference layer 112 will be described in greater detail herein below in regard to FIG. 4.

The second electrode 120 can be composed of one of the conductive metallic materials as the first electrode 90. In some embodiments, the second electrode 120 can be composed of a compositionally same conductive metallic material as the first electrode 90. In another embodiment, the second electrode 120 can be composed of a compositionally different conductive metallic material than the first electrode 90. The second electrode 120 can have a thickness from 2 nm to 25 nm; other thicknesses are possible and can be used in the present application as the thickness of the second electrode 120. The second electrode 120 can be formed by a deposition process such as, for example, sputtering, atomic layer deposition (ALD), chemical vapor deposition (CVD), plasma enhanced chemical vapor deposition (PECVD) or physical vapor deposition (PVD).

Figure 4:
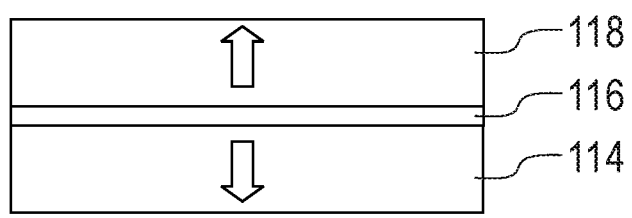
FIG. 4 is a cross sectional view of a magnetic reference layer that can be employed for one, or both, of the first magnetic reference layer and the second magnetic reference layer shown in FIG. 3, the magnetic reference layer including a lower magnetic reference layer, a synthetic anti-ferromagnetic coupling layer and an upper magnetic reference layer; in such applications the reference layer moment direction illustrated in FIG. 3 corresponds to the moment direction of one layer of the synthetic anti-ferromagnetic coupling layer that contacts the tunnel barrier.

Referring now to FIG. 4, there is illustrated a magnetic reference layer 113 that can be employed for one, or both, of the first magnetic reference layer 102 and the second magnetic reference layer 112 shown in FIG. 3, or in any of FIGS. 5A, 5B, 6, 7A and 7B. The magnetic reference layer 113 of FIG. 4 includes a lower magnetic reference layer 114, a synthetic anti-ferromagnetic coupling layer 116 and an upper magnetic reference layer 118. The lower magnetic reference layer 114 may be composed of one of the magnetic materials mentioned above for the first or second magnetic reference layers 102, 110. The synthetic anti-ferromagnetic coupling layer 116 is composed of non-magnetic material that can couple in an anti-parallel fashion the lower and upper magnetic layers 114, 118 of the magnetic reference layer 113. Exemplary non-magnetic materials that can be used as the synthetic anti-ferromagnetic coupling layer 116 include, but are not limited to, ruthenium (Ru), iridium (Jr) or rhodium (Rh). In one embodiment, the synthetic anti-ferromagnetic coupling layer 116 can have a thickness from 0.2 nm to 1.2 nm; although other thicknesses are possible and can be used as the thickness of the synthetic anti-ferromagnetic coupling layer 116. The upper magnetic reference layer 118 can be composed of one of the magnetic materials mentioned above for the first or second magnetic reference layers 102, 110. Typically, the upper magnetic reference layer 118 is compositionally different from the lower magnetic reference layer 114.

In one embodiment, the magnetic reference layer 113 is employed as the second magnetic reference layer 112, but not the first magnetic reference layer 102. In another embodiment, the magnetic reference layer 113 is employed as both the second magnetic reference layer 112 and the first magnetic reference layer 102. In yet a further embodiment, the magnetic reference layer 113 is employed as the first magnetic reference layer 102, but not the second magnetic reference layer 112.

Figure 5A:
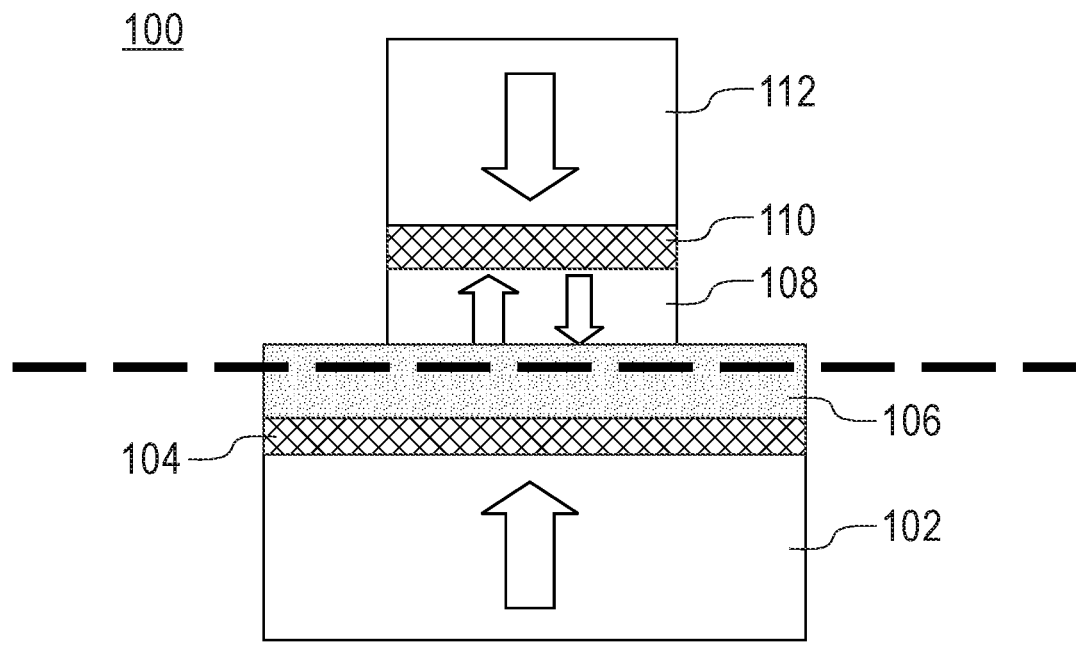
FIG. 5A is a cross sectional view of a mDMTJ structure in accordance with another embodiment of the present application. The dashed line indicates a possible "break" point between the growth of a lower portion of a non-magnetic, spin-conducting metallic layer and an upper portion of the non-magnetic, spin-conducting metallic layer.
Figure 5B:
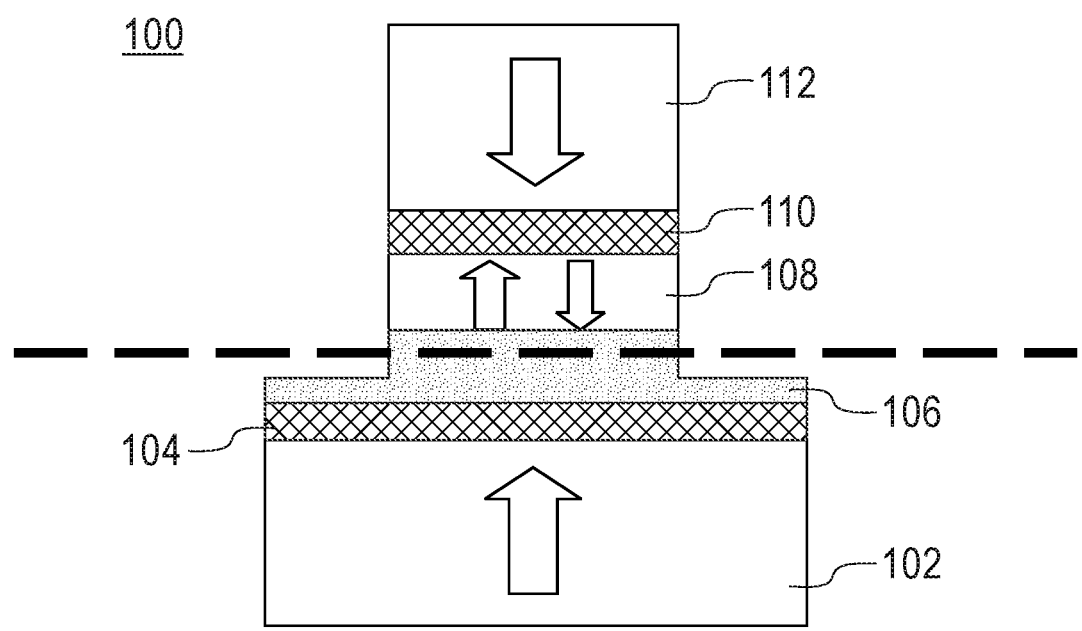
FIG. 5B is a cross sectional view of a mDMTJ structure in accordance with a further embodiment of the present application. The dashed line indicates a possible "break" point between the growth of a lower portion of a non-magnetic, spin-conducting metallic layer and an upper portion of the non-magnetic, spin-conducting metallic layer.

Reference is now made to FIGS. 5A-5B, there are illustrated mDMTJ structures 100 in accordance with other embodiments of the present application. The mDMTJ structures 100 of FIGS. 5A-5B include a first magnetic reference layer 102, as defined above, a first tunnel barrier layer 104, as defined above, contacting a surface of the first magnetic reference layer 102, a non-magnetic, spin-conducting metallic layer 106, as defined above, contacting a surface of the first tunnel barrier layer 104, a magnetic free layer 108, as defined above, contacting a surface of the non-magnetic, spin-conducting metallic layer 106, a second tunnel barrier layer 110, as defined above, contacting a surface of the magnetic free layer 108, and a second magnetic reference layer 112, as defined above, contacting a surface of the second tunnel barrier layer 110. The mDMTJ structures 100 shown in FIGS. 5A-5B illustrate embodiments in which the first magnetic reference layer 102 is located at a bottom portion of the mDMTJ structure, and the second magnetic reference layer 112 is located at a top portion of the mDMTJ structure.

Although not shown, the mDMTJ structures 100 of FIGS. 5A-5B are located between a first electrode, as defined above, and a second electrode, as defined. Collectively, the mDMTJ structure 100, the first electrode and the second electrode provide a STT MTJ memory element.

In FIGS. 5A-5B and 7A-7B, the horizontal dashed line indicates a possible "break" point between the growth of a lower portion of a non-magnetic, spin-conducting metallic layer 106 and an upper portion of the non-magnetic, spin-conducting metallic layer 106. In the embodiments shown in FIGS. 5A-5B and 7A-7B, the first tunnel barrier layer 104 has a lateral dimension that is greater than a lateral dimension of the second tunnel barrier layer 110. This difference in lateral dimension between the first tunnel barrier layer 104 and the second tunneling barrier layer 110 reduces the demand for ultra-low value of tunnel barrier's area specific resistance (i.e., resistance area product or RA). This also aids in the preservation of high TMR signal by reducing the overall added resistance to the mDMTJ structure 100. In FIGS. 5A-5B and 7A-7B, the non-magnetic, spin-conducting metallic layer 106 has a larger lateral dimension than the magnetic free layer 108 which aids in eliminating resistance in the device.

FIG. 5A shows an embodiment in which each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is less than the first lateral dimension.

FIG. 5B shows an embodiment that is similar to the embodiment depicted in FIG. 5A except that the magnetic free layer 108 is located on a pedestal portion of the non-magnetic, spin-conducting metallic layer 106, the pedestal portion of the non-magnetic, spin-conducting metallic layer 106 has the second lateral dimension, and a remaining portion of the non-magnetic, spin-conducting metallic layer 106 has the first lateral dimension. The pedestal portion is defined as a portion of a material that extends upward from a remaining portion of the same material. In some embodiments, the pedestal portion is created by recessing portions of a material that are not protected by some type of etch mask. In this embodiment depicted in FIG. 5B, the pedestal portion of the non-magnetic, spin-conducting metallic layer 106 extends outside of a via opening that is formed in an interconnect dielectric material layer.

Figure 6:
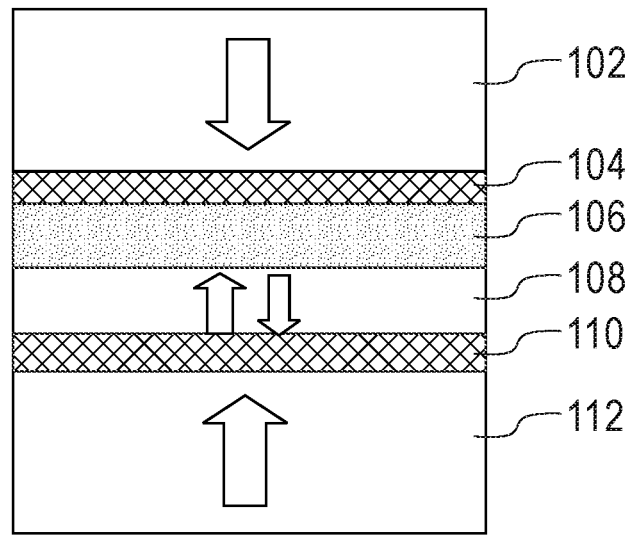
FIG. 6 is a cross sectional view of a mDMTJ structure in accordance with an embodiment of the present application.
Figure 7A:
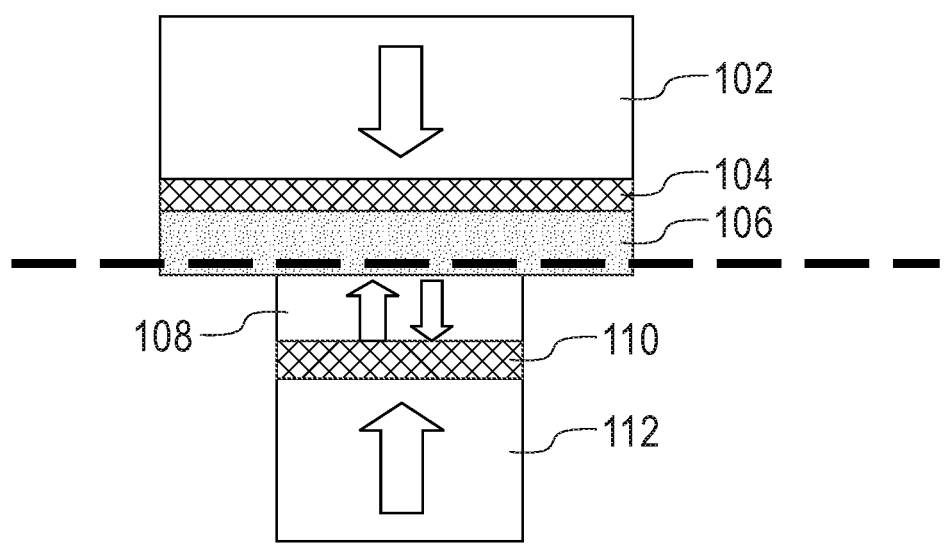
FIG. 7A is a cross sectional view of a mDMTJ structure in accordance with another embodiment of the present application. The dashed line indicates a possible "break" point between the growth of a lower portion of a non-magnetic, spin-conducting metallic layer and an upper portion of the non-magnetic, spin-conducting metallic layer.
Figure 7B:
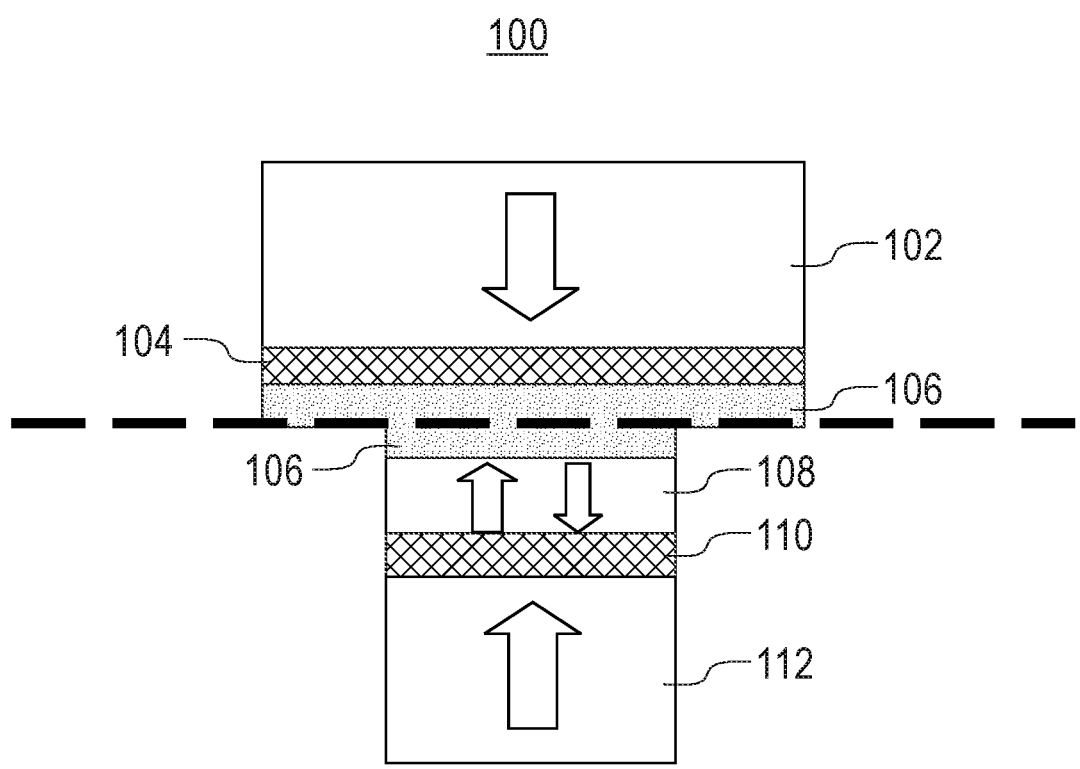
FIG. 7B is a cross sectional view of a mDMTJ structure in accordance with a further embodiment of the present application. The dashed line indicates a possible "break" point between the growth of a lower portion of a non-magnetic, spin-conducting metallic layer and an upper portion of the non-magnetic, spin-conducting metallic layer.

Referring now to FIGS. 6, 7A, and 7B, there are illustrated mDMTJ structures 100 in accordance with yet other embodiments of the present application. Each of the mDMTJ structures 100 of FIGS. 6, 7A and 7B includes a first magnetic reference layer 102, as defined above, a first tunnel barrier layer 104, as defined above, contacting a surface of the first magnetic reference layer 102, a non-magnetic, spin-conducting metallic layer 106, as defined above, contacting a surface of the first tunnel barrier layer 104, a magnetic free layer 108, as defined above, contacting a surface of the non-magnetic, spin-conducting metallic layer 106, a second tunnel barrier layer 110, as defined above, contacting a surface of the magnetic free layer 108, and a second magnetic reference layer 112, as defined above, contacting a surface of the second tunnel barrier layer 110. The mDMTJ structures 100 shown in FIGS. 6, 7A and 7B illustrate embodiments in which the first magnetic reference layer 102 is located at a top portion of the mDMTJ structure, and the second magnetic reference layer 112 is located at a bottom portion of the mDMTJ structure.

Although not shown, the DMTJ structures 100 of FIGS. 6, 7A, and 7B are located between a first electrode, as defined above, and a second electrode, as defined below. Collectively, the mDMTJ structure 100, the first electrode and the second electrode provide a STT MTJ memory element.

FIG. 6 shows an embodiment in which each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is the same as the first lateral dimension. Thus, each of the various layers present in the mDMTJ structure 100 shown in FIG. 6 has an outermost sidewall(s) that is(are) vertically aligned to each other.

FIG. 7A shows an embodiment in which each of the first magnetic reference layer 102, the first tunnel barrier layer 104, and the non-magnetic, spin-conducting metallic layer 106 has a first lateral dimension, and each of the magnetic free layer 108, the second tunnel barrier layer 110, and the second magnetic reference layer 112 has a second lateral dimension that is less than the first lateral dimension.

FIG. 7B shows an embodiment similar to the embodiment depicted in FIG. 7A except that the magnetic free layer 108 contacts a surface of a lower portion of the non-magnetic, spin-conducting metallic layer 104 that extends into a via opening that is present in an interconnect dielectric material layer, the upper portion of the non-magnetic, spin-conducting metallic layer 104 is present outside the via opening. The lower portion of the non-magnetic, spin-conducting metallic layer 106 that extends into the via opening has the second lateral dimension, and the upper portion of the non-magnetic, spin-conducting metallic layer 106 has the first lateral dimension.

The mDMTJ structures shown in FIGS. 5A-5B and 7A-7B are formed utilizing methods that decouple the formation of a lower material stack of the mDMTJ structure from an upper material stack of the mDMTJ structure. In some embodiments, the decoupling includes forming separate non-magnetic, spin-conducting material layers of a same or similar non-magnetic, spin-conducting metallic material, in the lower material stack and the upper material stack. Such decoupling allows for more flexibility in materials and growth engineering and fabrication optimization.

In one embodiment the method which can be used to provide the mDMTJ structures 100 shown in FIGS. 5A and 5B includes forming a lower material stack of the first magnetic reference layer 102, the first tunnel barrier layer 104 and a lower portion of the non-magnetic, spin-conducting metallic layer 106 and thereafter the lower material stack is lithographically patterned into a pillar shape. Next, an interconnect dielectric material layer is formed conformally laterally adjacent to, and above the pillar, and a via opening is subsequently formed stopping on the patterned lower portion of the non-magnetic, spin-conducting metallic layer 106. This structure is then planarized by, for example, chemical mechanical polishing, to remove the excess non-magnetic, spin-conducting metallic material, expose the top of via with a smooth non-magnetic, spin-conducting metallic surface. An upper material stack of an additional layer of the non-magnetic, spin-conducting material (forming an upper portion of non-magnetic, spin-conducting layer 106), the magnetic free layer 108, the second tunnel barrier layer 110, and the second magnetic reference layer 112 is thereafter formed on the processed lower material stack containing elements 102/104 and a lower portion of the non-magnetic, spin-conducting metallic layer 106 and above the via opening. The upper material stack containing an upper portion of the non-magnetic, spin-conducting metallic layer 106 and elements 06/108/110/112 can then be subsequently patterned lithographically to a desired diameter and depth for a MTJ memory, etch stopping at the dielectric surface. The diameter of the patterned upper material stack can be different, and preferably smaller, than the pillar diameter of the first material stack below the via.

In another embodiment the method which can be used to provide the mDMTJ structures 100 shown in FIGS. 7A and 7B includes forming a lower material stack of the mDMTJ structure, namely the second magnetic reference layer 112, the second tunnel barrier layer 110, the magnetic free layer 108, and a lower portion of the non-magnetic, spin-conducting layer 106. Thereafter, the lower material stack 112/110/108 and the lower portion of 106 are lithographically patterned to into a pillar of a desirable diameter for MTJ memory. An interconnect dielectric material is then conformally deposited laterally adjacent to, and above, the pillar. Next, a via opening is created on top of the pillar containing the lower material stack of elements 112/110/108 and the lower portion of 106, exposing a surface of the lower portion of the non-magnetic, spin-conducting layer 106. An upper material stack of an upper portion of the non-magnetic, spin-conducting metallic layer 106, the first tunnel barrier 104, and the first magnetic reference layer is formed above the via opening. This upper material stack is then lithographically patterned to a diameter preferably larger than the lower material stack below the via-like opening.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A modified double magnetic tunnel junction (mDMTJ) structure comprising:
a first magnetic reference layer;
a first tunnel barrier layer having a first surface in direct physical contact with a surface of the first magnetic reference layer;
a non-magnetic, spin-conducting metallic layer having a first surface in direct physical contact with a second surface of the first tunnel barrier layer which is opposite the first surface of the first tunnel barrier layer;
a magnetic free layer having a first surface in direct physical contact with a second surface of the non-magnetic, spin-conducting metallic layer which is opposite the first surface of the non-magnetic, spin-conducting metallic layer;
a second tunnel barrier layer having a first surface contacting a second surface of the magnetic free layer which is opposite the first surface of the magnetic free layer, and
a second magnetic reference layer having a first surface contacting a second surface of the second tunnel barrier layer which is opposite the first surface of the second tunnel barrier layer.

2. The mDMTJ structure of claim 1, wherein the first magnetic reference layer is located at a bottom portion of the mDMTJ structure, and the second magnetic reference layer is located at a top portion of the mDMTJ structure.

3. The mDMTJ structure of claim 2, wherein the second magnetic reference layer comprises a lower magnetic reference layer, an anti-ferromagnetic coupling layer, and an upper magnetic reference layer.

4. The mDMTJ structure of claim 2, wherein the first tunnel barrier layer and the second tunnel barrier layer have a same lateral dimension.

5. The mDMTJ structure of claim 2, wherein the first tunnel barrier layer has a first lateral dimension, and the second tunnel barrier layer has a second lateral dimension that is less than the first lateral dimension.

6. The mDMTJ structure of claim 5, wherein the magnetic free layer is located on a pedestal portion of the non-magnetic, spin-conducting metallic layer, the pedestal portion of the non-magnetic, spin-conducting metallic layer has the second lateral dimension, and a remaining portion of the non-magnetic, spin-conducting metallic layer has the first lateral dimension.

7. The mDMTJ structure of claim 1, wherein the second magnetic reference layer is located at a bottom portion of the mDMTJ structure, and the first reference layer is located at a top portion of the mDMTJ structure.

8. The mDMTJ structure of claim 7, wherein the second magnetic reference layer comprises a lower magnetic reference layer, an anti-ferromagnetic coupling layer, and an upper magnetic reference layer.

9. The mDMTJ structure of claim 7, wherein the first tunnel barrier layer and the second tunnel barrier layer have a same lateral dimension.

10. The mDMTJ structure of claim 7, wherein the first tunnel barrier layer has a first lateral dimension, and the second tunnel barrier layer has a second lateral dimension that is less than the first lateral dimension.

11. The mDMTJ structure of claim 10, wherein the magnetic free layer contacts a lower portion of the non-magnetic, spin-conducting metallic layer, the lower portion of the non-magnetic, spin-conducting metallic layer has the second lateral dimension, and an upper portion of the non-magnetic, spin-conducting metallic layer has the lateral first dimension.

12. A spin-transfer torque (STT) magnetic tunnel junction (MTJ) memory element comprising:
a modified double magnetic tunnel junction (mDMTJ) structure sandwiched between a first electrode and a second electrode, wherein the mDMTJ structure comprises a first magnetic reference layer, a first tunnel barrier layer having a first surface in direct physical contact with a surface of the first magnetic reference layer, a non-magnetic, spin-conducting metallic layer having a first surface in direct physical contact with a second surface of the first tunnel barrier layer which is opposite the first surface of the first tunnel barrier layer, a magnetic free layer having a first surface in direct physical contact with a second surface of the non-magnetic, spin-conducting metallic layer which is opposite the first surface of the non-magnetic, spin-conducting metallic layer, a second tunnel barrier layer having a first surface contacting a second surface of the magnetic free layer which is opposite the first surface of the magnetic free layer, and a second magnetic reference layer having a first surface contacting a second surface of the second tunnel barrier layer which is opposite the first surface of the second tunnel barrier layer.

13. The STT MTJ memory element of claim 12, wherein the first magnetic reference layer is located at a bottom portion of the mDMTJ structure, and the second magnetic reference layer is located at a top portion of the mDMTJ structure.

14. The STT MTJ memory element of claim 13, wherein the second magnetic reference layer comprises a lower magnetic reference layer, an anti-ferromagnetic coupling layer, and an upper magnetic reference layer.

15. The STT MTJ memory element of claim 13, wherein the first tunnel barrier layer and the second tunnel barrier layer have a same lateral dimension.

16. The STT MTJ memory element of claim 13, wherein the first tunnel barrier layer has a first lateral dimension, and the second tunnel barrier layer has a second lateral dimension that is less than the first lateral dimension.

17. The STT MTJ memory element of claim 16, wherein the magnetic free layer is located on a pedestal portion of the non-magnetic, spin-conducting metallic layer, the pedestal portion of the non-magnetic, spin-conducting metallic layer has the second lateral dimension, and a remaining portion of the non-magnetic, spin-conducting metallic layer has the first lateral dimension.

18. The STT MTJ memory element of claim 12, wherein the second magnetic reference layer is located at a bottom portion of the mDMTJ structure, and the first reference layer is located at a top portion of the mDMTJ structure.

19. The STT MTJ memory element of claim 18, wherein the second magnetic reference layer comprises a lower magnetic reference layer, an anti-ferromagnetic coupling layer, and an upper magnetic reference layer.

20. The STT MTJ memory element of claim 18, wherein the first tunnel barrier layer and the second tunnel barrier layer have a same lateral dimension.

21. The STT MTJ memory element of claim 18, wherein the first tunnel barrier layer has a first lateral dimension, and the second tunnel barrier layer has a second lateral dimension that is less than the first lateral dimension.

22. The STT MTJ memory element of claim 21, wherein the magnetic free contacts a lower portion of the non-magnetic, spin-conducting metallic layer, the lower portion of the non-magnetic, spin-conducting metallic layer has the second lateral dimension, and an upper portion of the non-magnetic, spin-conducting metallic layer has the first lateral dimension.

23. A method of forming a modified double magnetic tunnel junction (mDMTJ) structure, the method comprising:
  forming a lower material stack of the mDMTJ structure, wherein the lower material stack comprises, from bottom to top, a first magnetic reference layer, a first tunnel barrier layer, and a non-magnetic, spin-conducting metallic layer; and
  forming an upper material stack of the mDMTJ structure on a physically exposed topmost surface of the lower material stack of the mDMTJ structure, wherein the upper material stack comprises, from bottom to top, a magnetic free layer, a second tunnel barrier layer, a magnetic free layer, and a second magnetic reference layer, wherein the non-magnetic, spin-conducting layer has a first surface in direct physical contact with a surface of the first tunnel barrier layer, and a second surface, opposite the first surface, that is in direct physical contact with a surface of the magnetic free layer.

24. The method of claim 23, wherein the upper material stack includes another non-magnetic, spin-conducting metallic layer of a same non-magnetic, spin-conducting metallic material as the non-magnetic, spin-conducting metallic layer of the lower material stack, wherein the another non-magnetic, spin-conducting metallic layer of the upper material stack forms an interface with the non-magnetic, spin-conducting metallic layer of the lower material stack.

25. A method of forming a magnetoresistive random access memory (MRAM), the method comprising:
  forming a lower material stack of the mDMTJ structure, wherein the lower material stack comprises, from bottom to top, a second magnetic reference layer, a second tunnel barrier layer, and a magnetic free layer; and
  forming an upper material stack of the mDMTJ structure on a physically exposed topmost surface of the lower material stack of the mDMTJ structure, wherein the upper material stack comprises, from bottom to top, a non-magnetic, spin-conducting metallic layer, a first tunnel barrier layer, and a first magnetic reference layer, wherein the non-magnetic, spin-conducting layer has a first surface in direct physical contact with a surface of the first tunnel barrier layer, and a second surface, opposite the first surface, that is in direct physical contact with a surface of the magnetic free layer.

26. The method of claim 25, wherein the lower material stack includes another non-magnetic, spin-conducting metallic layer of a same non-magnetic, spin-conducting metallic material as the non-magnetic, spin-conducting metallic layer of the upper material stack, wherein the another non-magnetic, spin-conducting metallic layer of the lower material stack forms an interface with the non-magnetic, spin-conducting metallic layer of the upper material stack.

* * * * *